(12) United States Patent
Ahn et al.

(10) Patent No.: US 6,893,913 B2
(45) Date of Patent: May 17, 2005

(54) METHOD FOR FORMING CAPACITOR OF SEMICONDUCTOR DEVICE

(75) Inventors: Byoung Kwon Ahn, Seoul (KR); Sung Hoon Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/603,306

(22) Filed: Jun. 25, 2003

(65) Prior Publication Data

US 2004/0115880 A1 Jun. 17, 2004

(30) Foreign Application Priority Data

Dec. 11, 2002 (KR) .............................. 10-2002-0078659

(51) Int. Cl.[7] ......................................... H01L 21/8242
(52) U.S. Cl. ............................ 438/240; 438/3; 438/396
(58) Field of Search ........................... 438/3, 239–240, 438/253, 396, 243, 250

(56) References Cited

U.S. PATENT DOCUMENTS

| | | | |
|---|---|---|---|
| 6,014,310 A | 1/2000 | Bronner et al. | |
| 6,198,124 B1 | 3/2001 | Sandu et al. | |
| 6,207,561 B1 | 3/2001 | Hwang et al. | |
| 6,423,593 B1 * | 7/2002 | Yamamoto et al. | 438/240 |
| 6,461,911 B2 * | 10/2002 | Ahn et al. | 438/253 |
| 2003/0031793 A1 * | 2/2003 | Chang et al. | 427/255.28 |

FOREIGN PATENT DOCUMENTS

| | | |
|---|---|---|
| JP | 2000 68160 | 3/2000 |
| JP | 2000 353787 | 11/2000 |

* cited by examiner

Primary Examiner—Craig A. Thompson
Assistant Examiner—Thanhha Pham
(74) Attorney, Agent, or Firm—Ladas & Parry LLP

(57) ABSTRACT

Disclosed is a method for forming a capacitor of a semiconductor device. The forming method comprises the step of forming an interlayer insulating film on a semiconductor substrate formed with a bit line. A contact plug to be in contact with the substrate is formed within the interlayer insulating film. A storage electrode is formed on the interlayer insulating film in such a manner that the storage electrode comes in contact with the contact plug. A dielectric film composed of a single composite film of $Ta_2O_5(X)Y_2O_3$ (1–X) is also formed on the storage electrode according to ALD (Atomic Layer Deposition) technology. A diffusion barrier film is deposited on the dielectric film, and a plate electrode is formed on the diffusion barrier film. The present invention can provide a capacitor having sufficient capacitance necessary for a stable device operation by applying the $Ta_2O_5(X)Y_2O_3(1-X)$ single composite film to the dielectric film.

16 Claims, 3 Drawing Sheets

METHOD FOR FORMING CAPACITOR OF SEMICONDUCTOR DEVICE

BACKGROUND OF THE INVENTION

1. Field of the Invention

The present invention relates to a method for forming a capacitor of a semiconductor device, and more particularly to such a method by which the capacitor can secure high capacitance without loss of its performance.

2. Description of the Prior Art

It is a well-known fact that cell size grows smaller and smaller as a semiconductor device becomes more highly integrated. The smaller cell size is accompanied with a decrease in capacitor area, which in turn results in a reduction of capacitance. Consequently, the existing structure of a capacitor incurs a difficulty in securing sufficient capacitance necessary for constantly maintaining operational characteristics of a semiconductor device.

In a highly integrated semiconductor device currently being produced in mass quantities, a storage electrode is formed in a variety of 3-dimensional structures, high dielectric constant material is used as material of a dielectric film, or a dielectric film is formed at a thickness as thin as possible in order to secure capacitance over a certain amount necessary for cell operation. These measures are based on the fact that capacitance of a capacitor is proportional to electrode surface area and the dielectric constant of a dielectric film, and is inversely proportional to the distance between electrodes, that is, the thickness of the dielectric film.

For example, storage electrodes having a 3-dimensional structure such as a cylinder structure, a concave structure and a pin structure are intended to increase capacitance by enlarging an electrode surface area, and dielectric films such as $Ta_2O_5$, BST and the like are aimed toward increasing capacitance using high dielectric constant material.

On the other hand, since reducing a thickness of a dielectric film has limitations, studies into increasing capacitance are directed toward the enlargement of electrode surface area or the development of a dielectric film made of high dielectric constant material.

The enlargement of an electrode surface area, in particular, also involves difficult processes, and thus most studies are focused on providing high dielectric constant materials.

Although $Ta_2O_5$ film has a high dielectric constant, its formation is troublesome due to its material properties, and it reacts with polysilicon of a storage electrode to form an interface film when it is deposited according to a CVD (Chemical Vapor Deposition) method. In addition, $O_2$ loss occurring in a $Ta_2O_5$ film causes leakage current.

In conclusion, there is a difficulty in securing sufficient capacitance of a capacitor without loss of its performance through use of the conventional capacitor formation techniques and a single film of $Ta_2O_5$.

SUMMARY OF THE INVENTION

Accordingly, the present invention has been created in order to solve the above-mentioned problems occurring in the prior art, and an object of the present invention is to provide a method for forming a capacitor of a semiconductor device, by which the capacitor can secure sufficient capacitance necessary for device operation without loss of its performance.

To accomplish this object, the present invention provides a method for forming a capacitor of a semiconductor device comprising the steps of: forming an interlayer insulating film on a semiconductor substrate formed with a bit line, forming a contact plug in contact with the substrate within the interlayer insulating film, forming a storage electrode on the interlayer insulating film in such a manner that the storage electrode comes in contact with the contact plug, forming a dielectric film composed of a single composite film of $Ta_2O_5(X)Y_2O_3(1-X)$ on the storage electrode according to ALD (Atomic Layer Deposition) technology, depositing a diffusion barrier film on the dielectric film, and forming a plate electrode on the diffusion barrier film.

Herein, the step of forming the dielectric film comprises the sub-steps of: repetitively depositing a $Ta_2O_5$ thin film and a $Y_2O_3$ thin film in alternation to a predetermined thickness with ALD technology, performing low temperature annealing of the alternately deposited thin films to convert the thin films into a single composite film, performing $N_2O$ plasma annealing of the converted single composite film to remove carbon and impurities contained within the single composite film, and performing furnace annealing of the $N_2O$ plasma annealed single composite film to crystallize the single composite film.

Preferably, the $Ta_2O_5$ thin film is deposited to a thickness of less than 10 Å by alternately injecting $Ta(OC_2H_5)_5$ source gas and $H_2O$ reaction gas into a reactor at a temperature of 250 to 350° C., according to ALD technology. Inert gas is injected at a period of time between that of injecting the $Ta(OC_2H_5)_5$ source gas and that of injecting the $H_2O$ reaction gas, so as to leave no residue of the source and reaction gases. Each injection of the source gas, the inert gas and the reaction gas is performed for 0.1 to 10 seconds.

It is preferred that the $Y_2O_3$ thin film is deposited to a thickness of less than 5 Å by alternately injecting yttrium source gas and $H_2O$ reaction gas into a reactor at a temperature of 250 to 350° C., according to ALD technology. Inert gas is injected at a period of time between that of injecting the source gas and that of injecting the reaction gas, so as to leave no residue of the source and reaction gases. Each injection of the source gas, the inert gas and the reaction gas is performed for 0.1 to 10 seconds.

In the deposition of the $Ta_2O_5$ thin film and the $Y_2O_3$ thin film, $O_2$ or $N_2O$ gas can be injected as the reaction gas in place of $H_2O$. $N_2$, Ar or He can be used as the inert gas.

The $Ta_2O_5$ thin film and the $Y_2O_3$ thin film are repetitively deposited in alternation up to an overall thickness of 100 to 200 Å. The deposition ratio between the $Ta_2O_5$ thin film and the $Y_2O_3$ thin film is X: (1-X).

The low temperature annealing is performed at a temperature of 400 to 550° C. The $N_2O$ plasma annealing is carried out in a rapid thermal annealing mode in which annealing temperature is 300 to 400° C., annealing time is 60 to 180 seconds and $N_2O$ gas flow rate is 10 to 100 sccm. The furnace annealing is performed at a temperature of 600 to 850° C. for 5 to 60 minutes while $N_2$, $O_2$ or $N_2O$ gas flowing in a furnace.

The diffusion barrier film is a TiN film.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described in detail.

Figure 1A:
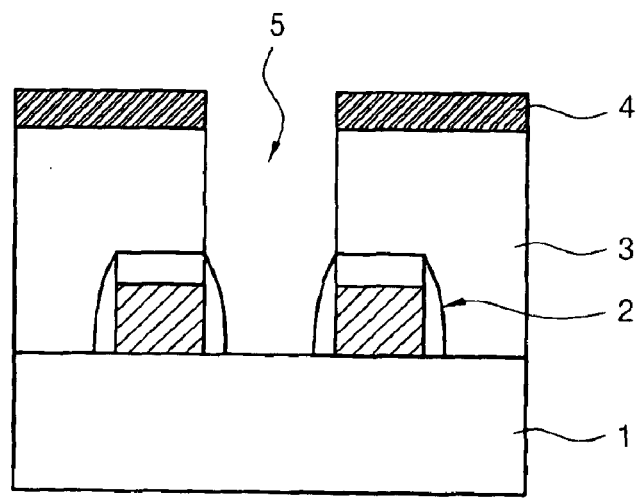
FIGS. 1a to 1f are sectional views according to process steps for explaining a forming method of a capacitor of a semiconductor device in accordance with a preferred embodiment of the present invention.

Referring to FIG. 1a, an interlayer insulating film 3 is deposited on a semiconductor substrate 1 which is formed with predetermined underlying layers including a bit line 2. The bit line 2 has a hard mask film on its surface, and a spacer is formed on sidewalls of the bit line 2 and the hard mask film. After this, a capping nitride film 4 is deposited on the interlayer insulating film 3. Subsequently, the interlayer insulating film 3 and the capping nitride film 4 are etched to form a contact hole 5 through which a predetermined portion of the substrate 1, for example, a junction area of a transistor is exposed.

Figure 1B:
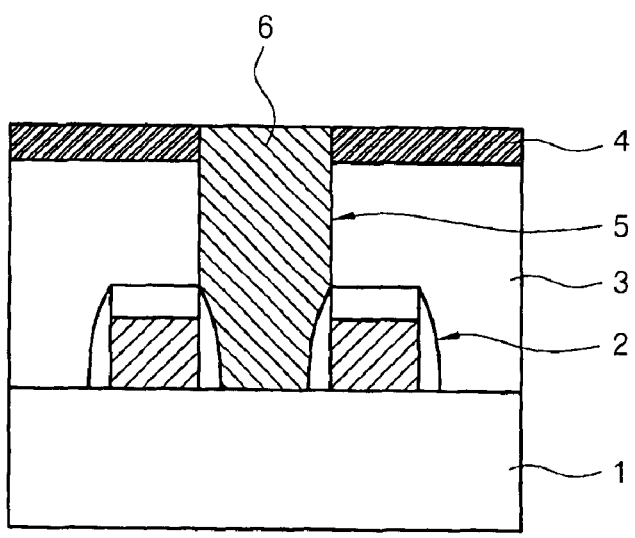

Referring to FIG. 1b, a conductive film for a plug, for example, a polysilicon film is deposited on the capping nitride film 4 until the contact hole 5 is filled up. Thereafter, overetch back of the polysilicon film is carried out to form a contact plug 6 for a capacitor within the contact hole 5.

Figure 1C:
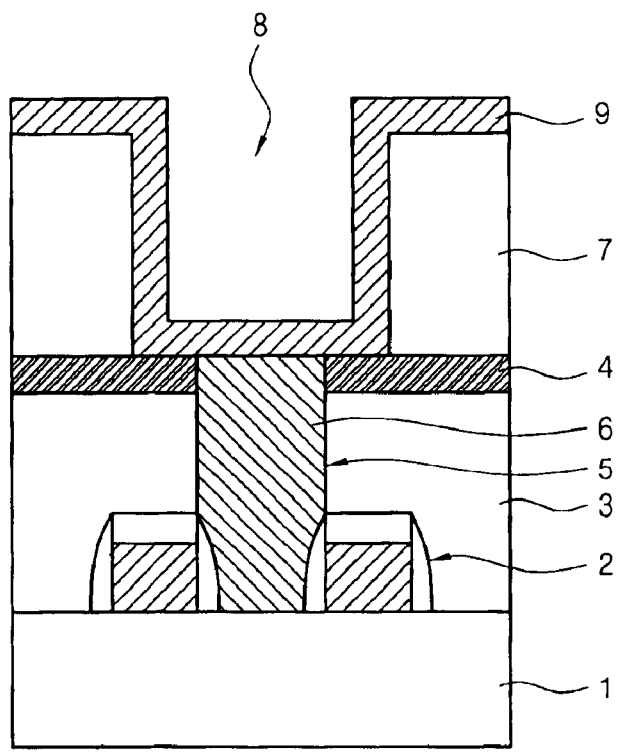

Referring to FIG. 1c, a sacrificing oxidation film 7 is deposited on the contact plug 6 and the capping nitride film 4 to a thickness of 5000 to 20000 Å in order to form a storage electrode having a cylindrical shape. Thereafter, the sacrificing oxidation film 7 is etched to form a trench 8 through which the contact plug 6 and the adjoining nitride film positions are exposed. Subsequently, a conductive film for storage electrode, for example, a polysilicon film 9 is deposited on the trench surface 8 and the sacrificing oxidation film 7.

At this time, it is preferred that an Anti-Reflection Coat layer (ARC layer) of SiON or a polysilicon film for a hard mask is also deposited after the sacrificing oxidation film 7 is deposited.

The polysilicon film 9 for the storage electrode is deposited under conditions maintaining a temperature of 500 to 550° C., preferably 530° C., and a pressure of 0.5 to 1 torr. In addition, the polysilicon film 9 is deposited in two separate steps: a first step of depositing a doped polysilicon film by flowing $SiH_4$ gas and $PH_3$ gas at flow rates of 800 to 1200 sccm and 150 to 250 sccm, respectively, and a second step of depositing a non-doped polysilicon film by flowing $SiH_4$ gas at a flow rate of 800 to 1200 sccm without flowing $PH_3$ gas. The doped polysilicon film is deposited to a thickness of 100 to 300 Å and the non-doped polysilicon film is deposited to a thickness of 100 to 500 Å.

Figure 1D:
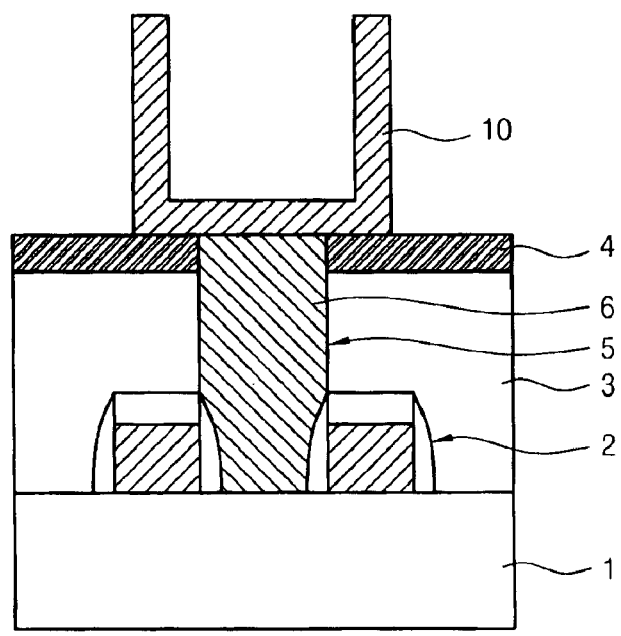

Referring to FIG. 1d, a photoresist film (not shown) is coated on the polysilicon film until the trench 8 is filled up. Thereafter, the photoresist film and the polysilicon film are etched so that the sacrificing oxidation film may be exposed. Subsequently, the remaining photoresist film and sacrificing oxidation film are removed to form a storage electrode 10 having a cylindrical structure.

At this time, the storage electrode 10 is formed in a cylindrical structure, but can be formed in other 3-dimemsinal structures such as a pin structure or the like. Besides, the storage electrode 10 can be provided on its surface with semispherical silicon for obtaining enhanced capacitance. The storage electrode 10 is not necessarily formed of polysilicon, but can be formed of metal.

Figure 1E:
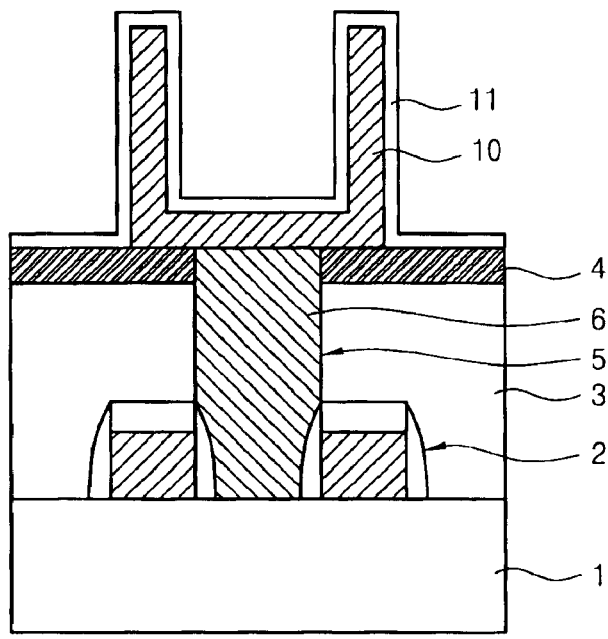

Referring to FIG. 1e, a dielectric film 11 composed of a single composite film of $Ta_2O_5(X)Y_2O_3(1-X)$ is formed according to ALD (Atomic Layer Deposition) technology on the resulting products of the substrate including the storage electrode 10.

More particularly, the composite film of $Ta_2O_5(X)Y_2O_3(1-X)$ is formed as follows:

First, a $Ta_2O_5$ thin film is deposited to a thickness of less than 10 Å by alternately injecting $Ta(OC_2H_5)_5$ source gas and $H_2O$ reaction gas into a reactor at a temperature of 250 to 350° C. According to ALD technology, assuming that one cycle consists of a source gas injection, an inert gas (N2, Ar or He) injection and an $H_2O$ gas injection, a deposition thickness per cycle of the $Ta_2O_5$ thin film is less than 1 Å, which means that it is possible to deposit a $Ta_2O_5$ thin film having a thickness of less than 10 Å by suitably adjusting the number of cycles. At this time, the inert gas injection between the $Ta(OC_2H_5)_5$ source gas injection and the $H_2O$ reaction gas injection is intended to leave no residue of the source and reaction gases. Preferably, each injection of the source gas, the inert gas and the reaction gas is performed for 0.1 to 10 seconds.

Next, a $Y_2O_3$ thin film is deposited to a thickness of less than 5 Å by alternately injecting yttrium source gas and $H_2O$ reaction gas into a reactor at a temperature of 250 to 350° C. According to ALD technology, assuming that one cycle consists of the source gas injection, the inert gas injection and the reaction gas injection, a deposition thickness per cycle of the $Y_2O_3$ thin film is less than 1 Å, and thus it is possible to deposit a $Ta_2O_5$ thin film having a thickness of less than 10 Å by suitably adjusting the number of cycles. Each injection time of the source gas, the inert gas and the reaction gas is 0.1 to 10 seconds.

In the deposition of the $Ta_2O_5$ and $Y_2O_3$ thin films, $O_2$ or $N_2O$ gas can be used as reaction gas in place of $H_2O$.

Subsequently, the $Ta_2O_5$ thin film and the $Y_2O_3$ thin film are alternately and repetitively deposited according to the above-mentioned procedures until their overall thickness reaches 100 to 200 Å. At this time, a deposition ratio between the $Ta_2O_5$ thin film and the $Y_2O_3$ thin film is preferably adjusted to a ratio of X:(1−X) which makes it possible to optimize electrical characteristics of a capacitor, for example, 80:20 with respect to the entire film.

Thereafter, the resulting film, which is repetitively deposited in alternation with the $Ta_2O_5$ thin film and the $Y_2O_3$ thin film, is subjected to low temperature annealing to be converted into a single composite film of $Ta_2O_5(X)Y_2O_3(1-X)$. Regarding this, even a low temperature is sufficient to convert the deposited film into a single composite film because thin films are repetitively deposited in alternation.

The $Ta_2O_5(X)Y_2O_3(1-X)$ single composite film is subjected to $N_2O$ plasma annealing to remove carbon and impurities contained within the film. The $N_2O$ plasma annealing is carried out in a rapid thermal annealing mode in which annealing temperature is 300 to 400° C., annealing time is 60 to 180 seconds and $N_2O$ gas flow rate is 10 to 100 sccm.

The low temperature annealing is followed by furnace annealing for crystallizing the N2O plasma annealed single composite film, which results in the final formation of a dielectric film 11 composed of the $Ta_2O_5(X)Y_2O_3(1-X)$ single composite film. The furnace annealing is carried out at a temperature of 600 to 850° C. for 5 to 60 minutes while $N_2$, $O_2$ or $N_2O$ gas flowing in a furnace.

Figure 1F:
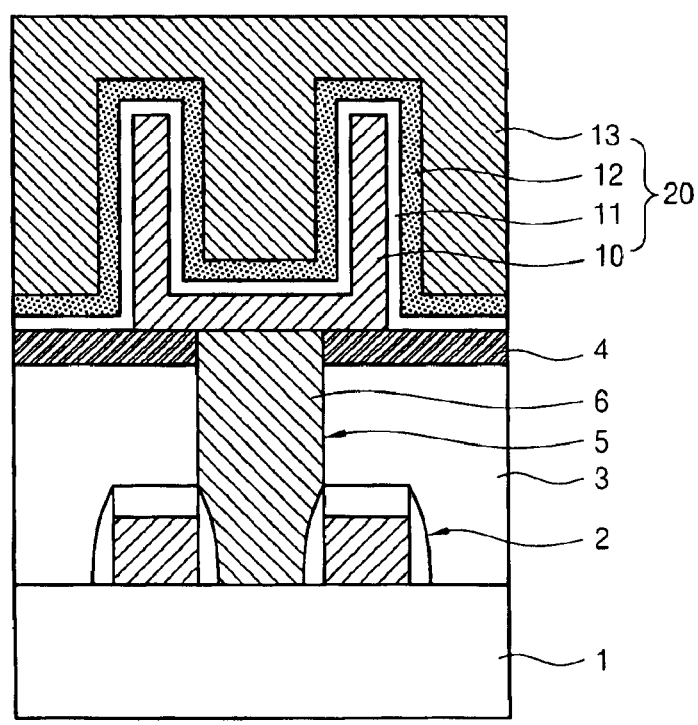

Referring to FIG. 1f, a diffusion barrier film 12 is formed on the dielectric film 11 composed of the $Ta_2O_5(X)Y_2O_3(1-X)$ single composite film in order to prevent an interface reaction with a plate poly due to the diffusion of oxygen within the film. Subsequently, a conductive film for a plate electrode, for example, a polysilicon film is deposited on the diffusion barrier film 12. Finally, the polysilicon film is patterned to form a plate electrode 13. In this way, a capacitor 20 in accordance with the present invention, which includes the dielectric film 11 composed of the $Ta_2O_5(X)$ $Y_2O_3(1-X)$ single composite film, is produced.

In coping with high integration of a semiconductor device, the capacitor 20 produced in accordance with the present invention can secure sufficient capacitance necessary for stably operating a semiconductor device over a typical capacitor, to which an ONO film is applied, because it is provided with the dielectric film composed of the single composite film of high dielectric constant materials, i.e., $Ta_2O_5$ and $Y_2O_3$.

Furthermore, since $Ta_2O_5$ and $Y_2O_3$ are deposited at a relatively low temperature of 250 to 350° C. according to ALD technology, the formation of an interface film at the interface between the storage electrode and the dielectric film can be minimized in a case of the dielectric film of $Ta_2O_5(X)Y_2O_3(1-X)$, which results in no leakage current.

As describe above, the present invention can provide a capacitor having sufficient capacitance necessary for a stable device operation by applying a $Ta_2O_5(X)Y_2O_3(1-X)$ single composite film to a dielectric film, so that can cope well with high integration of a semiconductor device. In the formation of the $Ta_2O_5(X)Y_2O_3(1-X)$ single composite film, an interface reaction between a storage electrode poly and $Ta_2O_5$ $(X)Y_2O_3(1-X)$ is minimized, and thus a capacitor having excellent properties, which causes no leakage current, can be provided.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a capacitor of a semiconductor device comprising the steps of:

forming an interlayer insulating film on a semiconductor substrate formed with a bit line;

forming a contact plug in contact with the substrate within the interlayer insulating film, forming a storage electrode of polysilicon on the interlayer insulating film in such a manner that the storage electrode comes in contact with the contact plug, forming layer of $Ta_2O_5$ and $Y_2O_3$ one layer over the other layer in an alternating fashion on the storage electrode according to ALD (Atomic Layer Deposition) technology, forming a dielectric film of a single composite film having $Ta_2O_6$ and $Y_2O_3$ on the storage electrode, depositing a diffusion barrier film on the dielectric film, and forming a plate electrode of polysilicon on the diffusion barrier film.

2. The method according to claim 1, wherein the step of forming the dielectric film comprises the sub-steps of:

performing low temperature annealing of the alternately deposited films of $Ta_2O_5$ and $Y_2 O_5$ converting the deposited films to a single composite film, performing $N_2O$ plasma annealing of the converted single composite film to remove carbon and impurities contained within the single composite film, and performing furnace annealing of the $N_2O$ plasma annealed single composite film to crystallize the single composite film.

3. The method according to claim 2, wherein the $Ta_2O_5$ thin film is deposited to a thickness of less than 10 Å by alternately injecting $Ta(OC_2H_5)_5$ source gas and $H_2O$ reaction gas into a reactor at a temperature of 250 to 350° C. according to ALD technology.

4. The method according to claim 3, wherein inert gas is injected at a period of time between that of injecting the $Ta(OC_2H_5)_5$ source gas and that of injecting the $H_2O$ reaction gas so as to leave no residue of the source and reaction gases.

5. The method according to claim 4, wherein any one selected from the group consisting Of $N_2$, Ar and He is injected as the inert gas.

6. The method according to claim 3, wherein each injection of the $Ta(OC_2H_5)_5$ source gas, the inert gas and the $H_2O$ reaction gas is performed for 0.1 to 10 seconds.

7. The method according to claim 2, wherein the $Y_2O_3$ thin film is deposited to a thickness of less than 5 Å by alternately injecting yttrium source gas and $H_2O$ reaction gas into a reactor at a temperature of 250 to 350° C. according to ALD technology.

8. The method according to claim 7, wherein inert gas is injected at a period of time between that of injecting the yittrium source gas and that of injecting the $H_2O$ reaction gas so as to leave no residue of the source and reaction gases.

9. The method according to claim 7, wherein each injection of the yittrium source gas, the inert gas and the $H_2O$ reaction gas is performed for 0.1 to 10 seconds.

10. The method according to claim 3, wherein in the deposition of the $Ta_2O_5$ thin film and the $Y_2O_3$ thin film, $O_2$ or $N_2O$ gas is injected as the reaction gas in place of $H_2O$.

11. The method according to claim 2, wherein the $Ta_2O_5$ films and the $Y_2O_3$ films are repetitively deposited in an alternating order to an overall thickness of 100 to 200 Å.

12. The method according to claim 2, wherein the deposition ratio between the $Ta_2O_5$ film and the $Y_2O_3$ film is about 80%:20%, respectively.

13. The method according to claim 2, wherein the low temperature annealing is performed at a temperature in the range of 400 to 550° C.

14. The method according to claim 2, wherein the $N_2O$ plasma annealing is carried out in a rapid thermal annealing mode in which annealing temperature is 300 to 400° C., annealing time is 60 to 180 seconds and $N_2O$ gas flow rate is 10 to 100 sccm.

15. The method according to claim 2, wherein the furnace annealing is performed at a temperature of 600 to 850° C. for 5 to 60 minutes while $N_2$, $O_2$ or $N_2O$ gas flowing in a furnace.

16. The method according to claim 1, wherein the diffusion barrier film is a TiN film.

* * * * *